(12) United States Patent
Beukema et al.

(10) Patent No.: US 8,867,668 B2
(45) Date of Patent: Oct. 21, 2014

(54) COUPLING SYSTEM FOR DATA RECEIVERS

(71) Applicant: International Business Machines Corporation, Armonk, NY (US)

(72) Inventors: Troy J. Beukema, Briarcliff Manor, NY (US); Gautam Gangasani, Hopewell Junction, NY (US); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/074,920

(22) Filed: Nov. 8, 2013

(65) Prior Publication Data

US 2014/0133604 A1    May 15, 2014

Related U.S. Application Data

(63) Continuation of application No. 13/173,434, filed on Jun. 30, 2011, now Pat. No. 8,599,966.

(51) Int. Cl.
| | |
|---|---|
| *H03K 9/00* | (2006.01) |
| *H04L 27/00* | (2006.01) |
| *H04L 25/02* | (2006.01) |
| *H03F 1/02* | (2006.01) |
| *H03G 3/30* | (2006.01) |
| *H03F 3/45* | (2006.01) |

(52) U.S. Cl.
CPC ........ *H03F 3/45695* (2013.01); *H04L 25/0296* (2013.01); *H03F 1/02* (2013.01); *H03G 3/3089* (2013.01)
USPC ............ 375/316; 330/127; 330/136; 330/185

(58) Field of Classification Search
CPC ................ H03F 1/34; H03F 2200/129; H03F 2200/144; H03F 1/3223; H03G 3/3089
USPC ................... 375/316, 319; 330/127, 136, 185
See application file for complete search history.

(56) References Cited

U.S. PATENT DOCUMENTS

| | | |
|---|---|---|
| 4,320,351 A | 3/1982 | Brown, Jr. et al. |
| 5,300,896 A | 4/1994 | Suesserman |

(Continued)

FOREIGN PATENT DOCUMENTS

JP    2009-278426    11/2009

OTHER PUBLICATIONS

English Abstract of JP Patent No. JP 2009-278426, Nov. 26, 2009.

(Continued)

*Primary Examiner* — Curtis Odom
(74) *Attorney, Agent, or Firm* — Scully, Scott, Murphy & Presser PC; Anne V. Dougherty, Esq.

(57) ABSTRACT

A data receiver, a method of operating a data receiver, and an integrated coupling system in a data receiver are disclosed. In one embodiment, the data receiver comprises an input terminal for receiving an input data signal, an input amplifier for amplifying selected components of the input data signal, and an input signal path for transmitting specified high-frequency components and a baseline component of the input data signal from the input terminal to the input amplifier. The data receiver further comprises a feed-forward resistive network connected to the input terminal and to the input amplifier. This feed forward resistive network is used to forward a low-frequency drift compensation signal from the input terminal to the input amplifier, using a passive resistive network, to compensate for low frequency variations in the input data signal, and to develop a desired bias voltage at the input amplifier.

20 Claims, 3 Drawing Sheets

WIDE INPUT DYNAMIC RANGE RECEIVER WITH INTEGRATED DC BLOCK AND FEED FORWARD RESTORE (INVENTION)

(56) References Cited

U.S. PATENT DOCUMENTS

| | | |
|---|---|---|
| 5,525,928 A | 6/1996 | Asakawa |
| 6,163,290 A | 12/2000 | Moreland et al. |
| 6,763,228 B2 | 7/2004 | Prentice et al. |
| 7,436,216 B1 | 10/2008 | Brunn et al. |
| 7,519,130 B2 | 4/2009 | Hsu et al. |
| 7,649,409 B1 | 1/2010 | Koh et al. |
| 7,760,013 B2 | 7/2010 | Bankman et al. |
| 2009/0160522 A1 | 6/2009 | Van Den Brande et al. |
| 2009/0268767 A1* | 10/2009 | Nelson ................. 372/38.02 |
| 2010/0090726 A1 | 4/2010 | Kim et al. |

OTHER PUBLICATIONS

Kuwata et al., "New Baseline Restorer Based on Feedforward Differential Compensation", IEEE Transactions on Nuclear Science, vol. 41, No. 4, Aug. 1994, pp. 1236-1239.

Sansen et al., "Feedforward Compensation Techniques for High-Frequency CMOS Amplifiers", IEEE Journal of Solid-State Circuits, vol. 41, Issue 4, Dec. 1990, pp. 1590-1595.

\* cited by examiner

DATA TRANSMISSION SYSTEM USING EXTERNAL DC BLOCK CAPACITORS

COUPLING SYSTEM FOR DATA RECEIVERS

CROSS-REFERENCE TO RELATED APPLICATIONS

This application is a continuation of U.S. patent application Ser. No. 13/173,434, filed Jun. 30, 2011, now U.S. Pat. No. 8,599,966, the entire contents and disclosure of which are hereby incorporated herein by reference.

BACKGROUND OF THE INVENTION

The present invention generally relates to data receivers, and more specifically, to coupling systems for data receivers.

Data receivers are formed on integrated circuits for receiving data from outside the integrated circuit. In order to increase adaptability, a data receiver may be designed to receive both AC and DC coupled input signals.

Data receivers require certain DC voltage bias levels to be present at the inputs of the first-stage signal amplifier which connects to an external data transmission line, to permit correct operation of the amplifier. In a typical high data range signaling application, differential transmission lines are used to convey the data information. The average voltage level of the signals on the two differential lines is called the "common mode" voltage. In general, data transmission devices which connect to the data receivers may not provide the required common-mode bias level to enable correct operation of the receiver input device. To solve this problem, common practice in the art is to employ the use of series "DC block" capacitors in the external line to isolate the DC bias level of the receiver input circuitry from the active transmitter elements. The external "DC block" capacitors enable the receiver to set its input common mode voltage independently of the transmission device to enable optimal operation of the receiver system.

A problem with the use of external DC block capacitors is the need for via drops to the data transmission lines (normally realized as impedance controlled differential stripline) to connect the DC block capacitor to the transmission lines in multi-layer boards. These via drops add unwanted impedance discontinuity, which degrades the signal quality. This problem becomes more and more severe at extremely high data rates such as 25 Gb/s, which is close to the state of the art data rate in electrical interconnect signaling systems today. The impedance discontinuity results in both signal level loss and signal time dispersion resulting from characteristic impedance mismatch which generates reflections. Further undesired issues with external DC block capacitors include component cost, size, and reliability. In particular, large computing/networking systems which implement millions of I/Os can benefit greatly by eliminating the cost, area, and potential unreliable external DC block connections due to manufacturing errors.

To eliminate the external DC block capacitor while still enabling transmit to receive common-mode isolation, an AC coupled common mode isolation circuit can be added directly on the receiver integrated circuit. Problems which immediately arise when taking this approach include signal amplitude loss due to a capacitive divider formed by the integrated AC coupling cap with the signal amplifier parasitic input capacitance, and signal integrity loss due to potentially large "baseline wander", or DC signal level variation, induced by variations in transmitted data as the received signal passes through the integrated AC coupling path. In particular, long runs of 1s or 0s can induce a transient bias on the differential DC component of the received signal after the integrated DC block capacitors, which can degrade the receiver sensitivity. This problem is more severe for an integrated DC block solution, since the needed isolation capacitors cannot be made as large as external DC block capacitors.

More specifically, external DC block capacitors often use capacitance values of approximately 100 nF in 50 ohm transmission systems, while an integrated capacitor, due to both die area and self-parasitic capacitance limitations, can only use a capacitance value of approximately 2 pF, which is 50,000 times smaller than the external DC block capacitor. This problem can be mitigated in an on-chip system design by using larger common mode termination resistance. As an example, a 100 k ohm common mode termination resistance, which is 2,000 times larger than the 50 ohm terminations used in the external line, might be used in conjunction with a high input impedance (MOS) active receiver input amplifier. However, this larger resistor does not make up the needed difference in AC coupling time constant to maintain needed differential baseline stability, since the time constant of 100 k and 2 pF (200 ns) is still much smaller than the time constant achievable with an external DC block capacitor (~5 us). Therefore, a method to mitigate the baseline wander associated with a smaller integrated DC block capacitor/RC time constant must be used to enable a practical integrated DC block solution.

A known solution to the baseline wander problem for integrated AC coupling systems is referred to as the Decision-Feedback Restore (DFR) based approach. In this approach, received data is detected, and fed back into the AC coupling circuit in a way designed to compensate baseline drift arising from the AC highpass corner formed by the series integrated DC block capacitors and the bias generation resistor loads. Although this approach will compensate baseline drift, the technique requires both detection of received data, and dynamic addition of received data signals to the input network with a precise, adapted gain control through a transmission re-generation circuit. In addition, if the received transmission signal has a duty cycle error (non-equal time duration of 1 and 0 data transmissions for binary line signaling), the DFR based system may not be able to correctly compensate the baseline drift due to transient baseline wander effects induced by the transmitter duty cycle error. Finally, this approach adds unwanted power to the receiver system design, by requiring both re-generation of the received high-speed data, and summing of the received data to the input signal with associated gain control and gain adaptation methods.

BRIEF SUMMARY

Embodiments of the invention provide a data receiver, a method of operating a data receiver, and an integrated alternating current (AC) coupling system in a data receiver. In one embodiment, the data receiver comprises an input terminal for receiving an input data signal, an input amplifier for amplifying selected components of the input data signal, and an input signal path for transmitting specified high frequency components and a baseline component of the input data signal from the input terminal to the input amplifier. The data receiver further comprises a feed forward resistive network connected to the input terminal and to the input amplifier. This feed forward resistive network is used to forward a low-frequency drift compensation signal from the input terminal to the input amplifier, using a passive resistive network, to compensate for low frequency variations in the input data signal, and to develop a desired bias voltage at the input amplifier.

In embodiments of the invention, the low frequency variations in the input data signal may comprise data variations which impact low frequency content (and create baseline wander through an AC coupled path, and may comprise common mode variation in the transmit signal input at the receiver.

In one embodiment, the low frequency drift compensation signal has an adjustable gain, and the feed forward restore network includes a control portion for adjusting the gain of this low frequency drift compensation signal.

In an embodiment, the input amplifier includes first and second amplifiers, and the input path includes first and second separate paths for transmitting components of the input data signal from the input terminal to the first and second amplifiers. The feed forward restore network includes a control for controlling the common mode bias of both of the first and second amplifiers.

In one embodiment, this control of the feed forward restore network includes a first bias control block for controlling the common mode bias of the first amplifier, and a second bias control block for controlling the common mode bias of the second amplifier.

In an embodiment, the input signal has a common mode voltage, and the low frequency variations in the input signal comprise low frequency variations in said common mode voltage; and the input amplifier has an amplifier common mode voltage, and said desired bias voltage at the input amplifier comprises said amplifier common mode voltage.

In one embodiment, the feed forward restore network includes a control portion to control the magnitude of the common mode voltage applied to the input amplifier to achieve a selected common mode voltage at the input amplifier.

In an embodiment, the common mode voltage applied to the input amplifier is adjustable, and the control portion of the feed forward restore network includes a current source and a current sink to facilitate achieving the selected common mode voltage at the input amplifier.

In one embodiment, the control portion of the feed forward restore network includes a control block to adjust the currents to the current sink and from the current source to achieve the selected common mode voltage at the input amplifier.

Embodiments of the invention achieve baseline wander compensation using a feed-forward restore (FFR) network realized with passive elements combined with current sources, while eliminating or greatly simplifying the need for any DC drift compensation gain control. Because the baseline wander compensation is based on the use of passive elements combined with low-current current sources, embodiments of the invention minimize the extra power added to the receiver circuit to realize the integrated DC block function. Low power is important in high density integrated I/O applications, where hundreds of I/O transceivers may be integrated on the chip.

DETAILED DESCRIPTION

The present invention generally relates to data receivers, and more specifically, to a coupling system for data receivers. Embodiments of the invention provide an apparatus and method to realize integrated on-chip AC coupling in a receiver termination network that are well suited for application in high rate data receiver integrated circuits.

Figure 1:
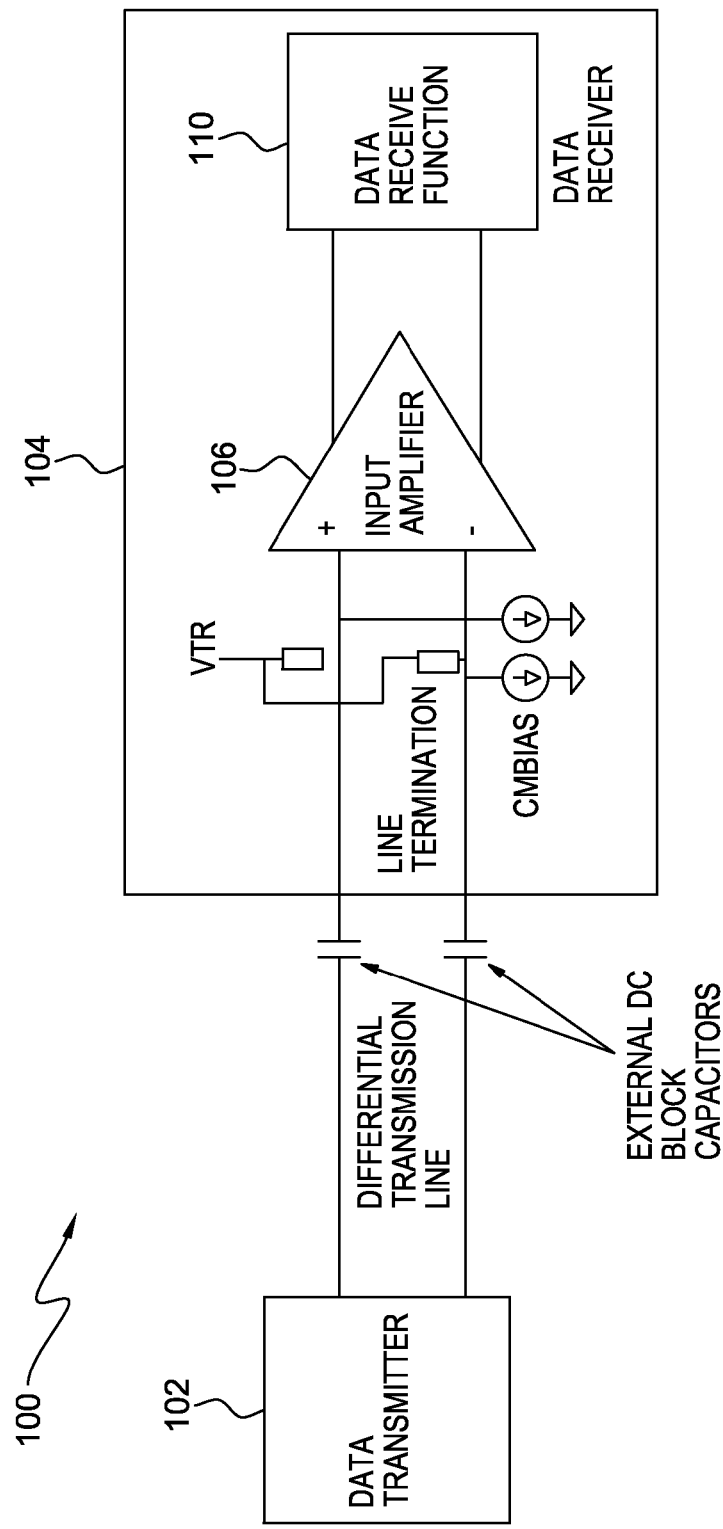
FIG. 1 illustrates a conventional data transmission system using external DC Block Capacitors.

FIG. 1 illustrates a conventional data transmission system 100 comprising data transmitter 102 and data receiver 104; and data receiver 104, in turn, includes first stage amplifier 106 and data receive function 110. As mentioned previously, data receivers require certain DC voltage bias levels to be present at the inputs of the first-stage signal amplifier which connects to an external data transmission line, to permit correct operation of the amplifier 106. In a typical high data rate signaling application as shown in FIG. 1, differential transmission lines 112 are used to convey the data information. The average voltage level of the signals on the two differential lines is called the "common mode" voltage. In general, data transmission devices which connect to the data receivers may not provide the required common-mode bias level to enable correct operation of the receiver input device. To solve this problem, common practice in the art is to employ the use of series "DC block" capacitors 114 in the external line 112 to isolate the DC bias level of the receiver input circuitry from the active transmitter elements 102 as shown in FIG. 1. The external "DC block" capacitors enable the receiver 104 to set its input common mode voltage independently of the transmission device 102 to enable optimal operation of the receiver system.

A problem with the use of external DC block capacitors is the need for via drops to the data transmission line to connect the DC block capacitors to the transmission lines in multilayer boards. These via drops, however, have their own disadvantages such as increased signal level loss and signal time dispersion.

To eliminate the external DC block capacitor while still enabling transmit-to-receive common mode isolation, an AC-coupled common mode isolation circuit can be added directly on the receiver integrated circuit. With this approach, significant variations in the low-frequency signal level, referred to as "baseline wander," can occur. These variations are induced by variations in the transmitted data as the received signal passes through the integrated AC coupling path.

Embodiments of the invention provide a method and system of baseline wander compensation for integrated DC block data receiver systems. Embodiments of the invention achieve this baseline wander compensation using a feed-forward restore (FFR) network realized with passive elements combined with current sources, while eliminating or greatly simplifying the need for any DC drift compensation gain control. Because the baseline wander compensation is based on the use of passive elements combined with low-current current sources, embodiments of the invention minimize the extra power added to the receiver circuit to realize the integrated DC block function. Low power is important in high density integrated I/O applications, where hundreds of I/O transceivers may be integrated on the chip.

Figure 2:
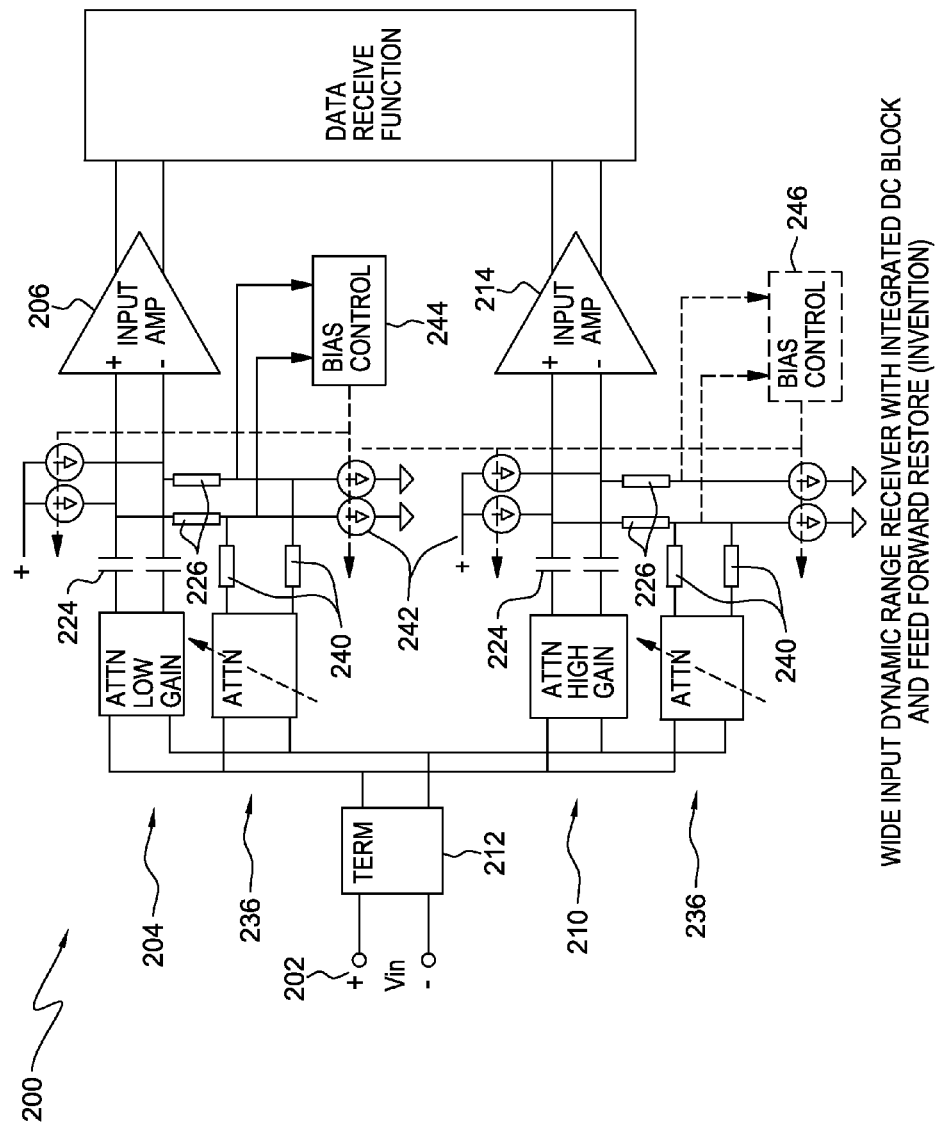
FIG. 2 is a block diagram of data receiver with a feed forward restore network in accordance with an embodiment of the invention.

A high level block diagram of an embodiment of the invention, as embodied in an application of a wide input dynamic range differential data receiver front-end, is shown in FIG. 2. This diagram illustrates a typical receiver front-end termination/amplifier network 200, as is realized in modern high-data-rate differential transceiver systems. A received differential signal with encoded data information from an external line is presented at input pins 202 which normally connect to an external IC package, such as a ball-grid array (BGA) package. The wide dynamic range data receiver is capable of operating over a range of input signals typically approaching 1200 mVppd at the high end and 50 mVppd at the low end. To enable the 1200 mVppd input signal to be processed by the receiver's active circuit without distortion, a "Low Gain" input path 204 provides attenuation of nominally 6 dB (divide by 2) prior to the active amplifier 200. Under this condition, a second "High Gain" input path 210 of the receiver is de-activated, and the signal is able to pass through active input amplifier 200 undistorted. When a smaller signal (<600 mVppd typical) is received, the signal is able to be sent linearly through the second the second "high gain" path 210, which provides a signal attenuation of nominally 0 dB (pass-through). Under this (smaller input signal) condition, both "High Gain" and "Low Gain" paths 210, 204 are active, in an embodiment, contributing constructive amplification of the received signal.

In operation, a high data rate signal is input to the receiver 200 at input port 202. In an embodiment, the received signal is differential, which is normally preferred over a single-ended signal in high data rate transmissions systems in the range of 6 Gb/s and higher. The received signal is terminated by block TERM 212 which normally provides a resistive line termination equal to the characteristic impedance of the external transmission line channel, such as 50 ohms single-ended or 100 ohms differential. Following termination, the signal is passed to one or more passive attenuator/input amplifier stages. In the example wide-dynamic input range receiver front end, there are two attenuator/input stages 204, 210, one "Low Gain" and one "High Gain". As described above, the "Low Gain" path attenuates the signal by a nominal 6 dB before passing it on to the active input amplifier 200, while the "High Gain" path is pass-through (no attenuation). To isolate the input amplifiers 206, 214 input common-mode voltage from the common-mode voltage on the external line, which may not be compatible with the needed voltage for correct amplifier operation, integrated DC block capacitors 224 are used. These capacitors are normally quite small (1-2 pF range in modern CMOS integrated circuit technology), and form a relatively high low-frequency cutoff when driving the amplifier bias resistors 226 of the input amplifiers.

To eliminate the low-frequency cutoff, high impedance bias termination resistances 226 are DC coupled to the input terminal 212 through a second attenuation path 236 (which may be a much higher impedance attenuator than the high frequency attenuator path) using feed-forward resistors 240, thereby providing a low-frequency feed-forward (FFR) path. The desired input common-mode voltage of input amplifiers 206, 214 is then established by pushing or pulling current through the feed-forward resistors 240 using current sources 242. Bias control block 244, adjusts the currents 242 to achieve a desired common mode voltage at the input of the amplifier 206. In one embodiment of a wide dynamic range receiver with a high-gain/low-gain parallel path architecture as shown in FIG. 2, a single bias control unit is applied on the "low gain" path 204 (the path which attenuates the input signal and is always active), and this bias control unit also controls the current in the "high gain" path 210 using a replica bias. It is also possible to provide independent bias control blocks for both high and low gain paths 210, 204, as diagrammed in FIG. 2 with a dashed bias control 246, though this approach uses plural bias control units 244, 246.

Figure 3:
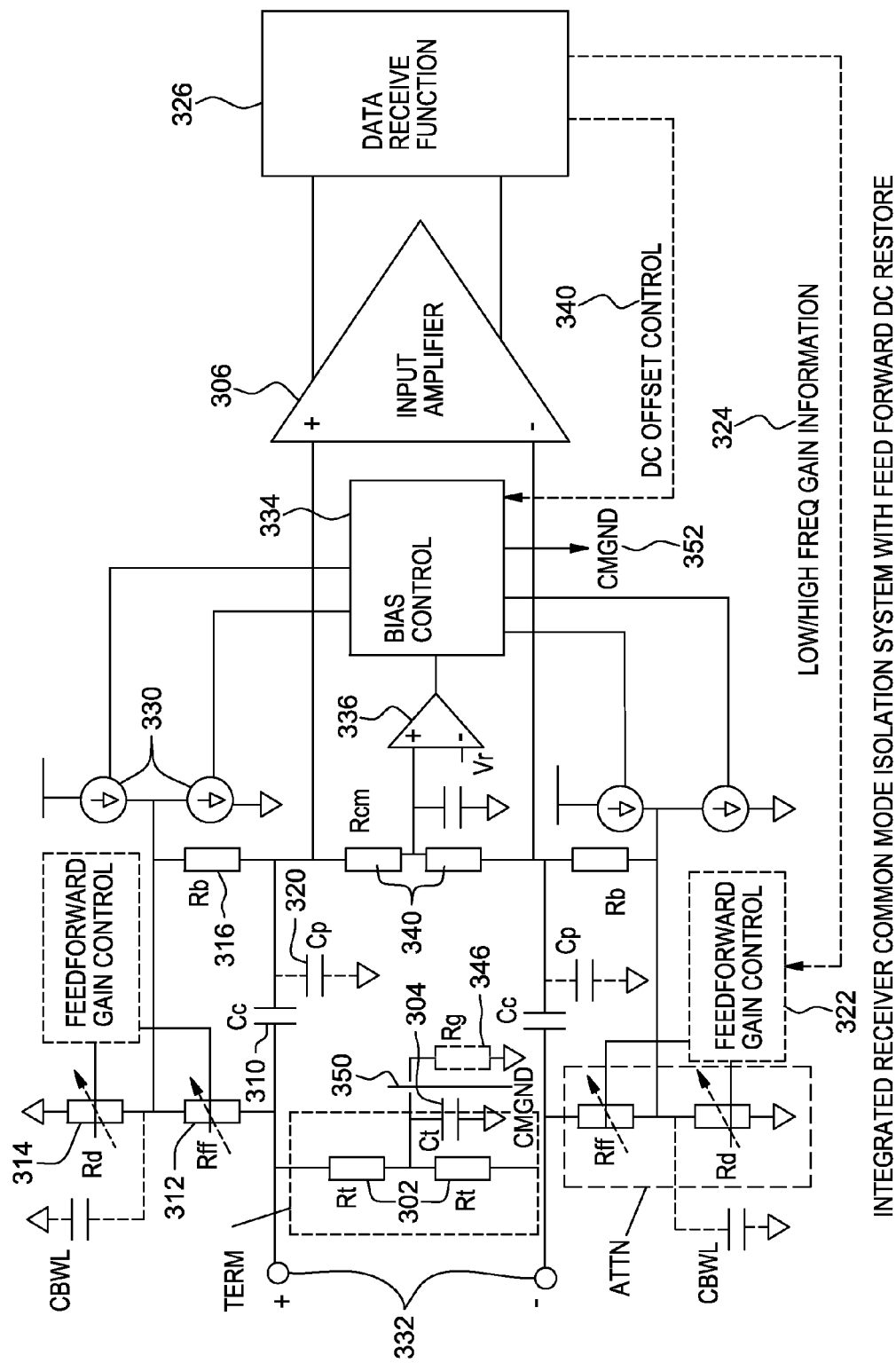
FIG. 3 is a more detailed diagram of a portion of the circuit shown in FIG. 2, showing the common mode isolation system and the feed forward DC restore network of the circuit.

A further detailed description of the invention is shown in FIG. 3. To simplify the detailed description without loss of generality, a single-path receiver front-end is shown in the detailed figure. The line signal is terminated to ground with termination resistors Rt 302. The common tap of the line termination resistors may be either directly grounded or connected to ground through an AC capacitor Ct 304 as shown in the figure. To isolate any common mode voltage which may be on the line from the receiver first-stage input amplifier 306, integrated coupling capacitors Cc 310 are placed in series with the amplifier inputs.

Since the DC signal level does not pass through DC block capacitor Cc 310, DC imbalanced input data (or any input data signal with low frequency content) can be distorted when passing through the capacitors without some form of low-frequency drift compensation. In an embodiment of the invention, low-frequency DC compensation is provided using a novel passive feed-forward resistance divider network formed by feed-forward resistor Rff 312 and divider resistor Rd 314. This resistor network gain scales and feeds forward the DC component of the input signal to the input amplifier 306, effectively restoring the low-frequency response of the receiver. In one embodiment, feed-forward resistor Rff (nominally 5 k ohm resistance value) is made much smaller than bias isolation resistor Rb 316 (nominally 100 k ohm resistance value when used in conjunction with a high input impedance MOSFET amplifier 306), so that DC voltage at the junction of feed-forward resistor Rff 312 and divider resistor Rd 314 can be adjusted to approximately match the high-frequency signal loss arising from the capacitive division of AC coupling capacitor Cc 310 with ground parasitic capacitance Cp 320. Parasitic coupling capacitance Cp arises due to fringe wiring capacitances to ground in the coupling capacitor Cc itself, interconnect wires on the chip, and input capacitance of the active devices in input amplifier 306.

The value of resistors Rd and/or Rff can be made variable, in an embodiment, using techniques known in the art such as CMOS passgates used to switch in/out parallel or series resistance values, to enable the resistive divide ratio of the feed-forward bias network to be adjusted to closely match the high frequency capacitive divide ration of the DC block capacitor with its output parasitic capacitance load. The adjustment of resistor values Rd and/or Rff may be static, or adapted. In the static adjustment case, the resistor values may be either adjusted at design time and frozen thereafter, or adjusted at system powerup to a nominal match of the expected capacitive division ratio of Cc with Cp. In the dynamic adjustment case, a control process implemented in process control block FEEDFORWARD GAIN CONTROL 322, may adapt the settings of the feed-forward gain to minimize the difference between high frequency gain and low frequency gain of the input termination/bias control network, where the low and high frequency gain information 324, in an embodiment, is provided by data receive process function 320.

The DC bias voltage at first-stage receiver amplifier 306 is established by passing a DC voltage to the + and − inputs of the amplifier through bias isolation resistors Rb 316. In one embodiment, first-stage receiver amplifier 306 is realized with a high input impedance MOSFET input stage, enabling the use of a very large bias isolation resistor (100 k ohms nominal). The DC bias voltage which passes through Rb 316 in turn is generated using a combination of bias current sources 330 which are capable of either sourcing or sinking current through the feedforward resistive divider network formed by feed-forward resistor Rff 312 and divider resistor Rd 314. By appropriately controlling current sources 330, the DC bias level at the input of the receiver amplifier 306 may be controlled independently of the bias level presented at the receiver input ports 332. Resistor Rff can therefore be seen to provide both feed-forward DC restoration to the input amplifier, and common-mode isolation. An optional feedforward bandwidth limit capacitor CBWL 334 may be used to lower the dynamic signal swing at the junction of common-mode bias current sources 330.

The common-mode bias current sources 330 are controlled by a bias control process 334 which in an embodiment will accept an error difference signal from a bias error amplifier 336. Bias error amplifier 336 outputs a signal proportional to the difference between a desired bias level Vr and the sensed common mode at the input terminal. The common mode at the input terminal is generated in this example by tapping the central node at common mode sense resistors Rcm 340 which in an embodiment have much higher impedance (approx. 50 k ohm) than the line termination resistors so they present minimal signal load on the line. In operation, bias control process 334 adjusts the bias current sources 330 to achieve a nominal average match of the desired bias level Vr and the sensed common mode at the high speed amplifier input. Bias control process 334 may optionally input a DC OFFSET CONTROL 340 signal from a DATA RECEIVE FUNCTION 326 process to enable an offset to be applied to the positive and negative differential lines through differential control of bias current sources 330. This enables a differential DC offset to be added, in addition to a nominal common mode bias, at the input of receiver amplifier 306, to compensate any offsets arising from process variations in the fabrications of the active devices used to realize the amplifier and/or following components embedded in the process block RECEIVE FUNCTION 326.

In the special case that the external line may have DC isolation capacitors, the common-mode voltage at the signal input 332 will be zero. In this special case, it is necessary to provide a common-mode ground-return path in the input common-mode bias network. This ground-return path may be provided using a resistor Rg 346, which in one embodiment has a much higher impedance (approximately 10 k ohm) that the line terminations resistors Rt 302. The resistor Rg may be optionally switched in or out using switch 350 controlled under the control of -bias control process 352, or it may be connected all the time, independent of the use of an external DC block capacitor. One or more ground-path resistors Rg may be placed at any point in the input bias network which provides a path to a local ground to enable the common-mode bias network to have a ground-reference point to establish the desired local common-mode bias at the input of amplifier 306.

Embodiments of the invention provide a number of important advantages. For example, embodiments of the invention do not require received data to be decoded to function, as opposed to a decision-restore feedback (DFR) scheme. Also, embodiments of the invention automatically adjust the level of the feedforward DC compensation as the input signal level varies (as opposed to a DFR-based system, which must re-adapt gain control after input signal level changes), i.e., embodiments of the invention works with one fixed level of feedforward DC gain across all input signal levels.

Embodiments of the invention may require no gain adaptation on start-up: as long as the high frequency AC divide ratio is reasonably stable, the FFR gain can be fixed, so the drift compensation system will be functioning correctly immediately at startup, with no wait for a gain adapt as needed by DFR. In addition, duty cycle error on the input is not compensated by DFR, while with embodiments of the invention, the input signal can have duty cycle error without degrading the DC compensation.

Embodiments of the invention have low power requirements. In embodiments of the invention, there is no active, high-power consuming elements in the passive feed-forward network. The only active components in the described invention are the needed bias currents to establish the common mode level, which are very small, and the bias control process which can be implemented in low power CMOS logic.

Embodiments of the invention have the potential to work without any gain adaptation at all, using a fixed feed-forward gain ratio. DFR must use gain adaptation. Also, due to the broadband nature of the passive feedforward network, the potential to use smaller bias resistor or coupling capacitor values exists with embodiments of the invention, limited only by the broadband loss associated with the capacitive division of the series integrated AC coupling capacitor and the parasitic capacitance at the input amplifier load. In one embodiment, for example, the integrated AC coupling capacitor may be sized for no more than 1 to 2 dB broadband loss at maximum.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. A feed forward restore network to forward an input data signal to an amplifier circuit portion, the network comprising:
   an input terminal for receiving an input data signal with encoded data information;
   a low gain path for conducting the input data signal from the input terminal to an amplifier circuit portion, said low gain path providing a specified attenuation to the input data signal;
   a high gain path for conducting the input data signal substantially undistorted from the input terminal to the amplifier circuit portion; and wherein
   when the input data signal is above a specified level, the high gain path is deactivated and the signal passes through the low gain path;
   when the input data signal is below the specified level, both the low gain path and the high gain path are active and the data input signal passes through both the low gain path and the high gain path; and
   the feed forward restore network further comprises a passive resistive network to forward a low frequency drift compensation signal from the input terminal to the amplifier circuit portion to compensate for low frequency variations in the input data signal and to develop a desired bias voltage at the amplifier circuit portion.

2. The feed forward restore network according to claim 1, wherein the low frequency variations in the input signal arise from low frequency data patterns in the input data signal, which result in baseline wander when passed through an AC coupled path.

3. The feed forward restore network according to claim 1, wherein the low frequency compensation signal has an adjustable gain.

4. The feed forward restore network according to claim 3, further comprising a control portion for adjusting the gain of the low frequency compensation signal.

5. The feed forward restore network according to claim 1, wherein:
   the amplifier circuit portion includes first and second amplifiers, each of the amplifiers having a common mode bias; and
   the feed forward restore network further comprises a control for controlling the common mode bias of both the first and second amplifiers.

6. The feed forward restore network according to claim 5, wherein the control includes:
- a first bias control block for controlling the common mode bias of the first amplifier; and
- a second bias control block for controlling the common mode bias of the second amplifier.

7. The feed forward restore network according to claim 1, wherein:
- the input data signal has an input signal common mode voltage, and the low frequency variations in the input signal comprise low frequency variations in said common mode voltage; and
- the amplifier circuit portion has an amplifier common mode voltage, and said desired bias voltage at the amplifier circuit portion comprises said amplifier common mode voltage.

8. The feed forward restore network according to claim 7, further comprising a control portion to control the magnitude of the common mode voltage applied to the amplifier circuit portion to achieve a selected common mode voltage at the amplifier circuit portion.

9. The feed forward restore network according to claim 8, wherein the common mode voltage applied to the amplifier circuit portion is adjustable.

10. The feed forward restore network according to claim 9, wherein the control portion of the feed forward restore network includes:
- a current source and a current sink to facilitate achieving the selected common mode voltage at the amplifier circuit portion; and
- a control block to adjust the currents to the current sink and from the current source to achieve the selected common mode voltage at the amplifier circuit portion.

11. A method of operating a feed forward restore network in a data receiver to forward an input data signal to an amplifier circuit portion, wherein the feed forward restore network comprises an input terminal for receiving an input data signal with encoded data information; a low gain path for conducting the input data signal from the input terminal to an amplifier circuit portion, said low gain path providing a specified attenuation to the input data signal; and a high gain path for conducting the input data signal substantially undistorted from the input terminal to the amplifier circuit portion; the method comprising:
- when the input data signal is above a specified level, deactivating the high gain path and passing the input data signal through the low gain path;
- when the input data signal is below the specified level, activating both the low gain path and the high gain path and passing the data input signal through both the low gain path and the high gain path; and
- wherein the feed forward restore network further comprises a passive resistive network, and the method further comprises using the feed forward restore network to forward a low frequency drift compensation signal from the input terminal to the amplifier circuit portion to compensate for low frequency variations in the input data signal and to develop a desired bias voltage at the amplifier circuit portion.

12. The method according to claim 11, wherein the low frequency variations in the input signal arise from low frequency data patterns in the input data signal, which result in baseline wander when passed through an AC coupled path.

13. The method according to claim 11, wherein: the low frequency drift compensation signal has an adjustable gain.

14. The method according to claim 13, further comprising adjusting the gain of the low frequency drift compensation signal.

15. The method according to claim 11, wherein:
- the amplifier circuit portions includes first and second amplifiers, each of the amplifiers having a common mode bias; and
- the method further comprises controlling the common mode bias of both the first and second amplifiers.

16. The method according to claim 15, further comprising:
- using a first bias control block for controlling the common mode bias of the first amplifier; and
- using a second bias control block for controlling the common mode bias of the second amplifier.

17. The method according to claim 11, wherein:
- the input data signal has a common mode voltage, and the low frequency variations in the input signal comprise low frequency variations in said common mode voltage; and
- the amplifier circuit portion has an adjustable amplifier common mode voltage, and said desired bias voltage at the input amplifier comprises said amplifier common mode voltage.

18. The method according to claim 17, wherein the feed forward restore network includes a control portion, and the method further comprises using said control portion to control the magnitude of the common mode voltage applied to the amplifier circuit portion to achieve a selected common mode voltage at the amplifier circuit portion.

19. The method according to claim 18, wherein the common mode voltage applied to the amplifier circuit portion is adjustable.

20. The method according to claim 19, further comprising:
- using a current source and a current sink to facilitate achieving the selected common mode voltage at the amplifier circuit portion; and
- using a control block to adjust the currents to the current sink and from the current source to achieve the selected common mode voltage at the amplifier circuit portion.

* * * * *